United States Patent
Yen et al.

(10) Patent No.: US 9,530,705 B2
(45) Date of Patent: Dec. 27, 2016

(54) 4 PORT L-2L DE-EMBEDDING METHOD

(71) Applicant: Taiwan Semiconductor Manufacturing Co. Ltd., Hsin-Chu (TW)

(72) Inventors: Hsiao-Tsung Yen, Tainan (TW); Chin-Wei Kuo, Zhubei (TW); Chih-Yuan Chang, Hsinchu (TW); Min-Chie Jeng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 898 days.

(21) Appl. No.: 13/864,376

(22) Filed: Apr. 17, 2013

(65) Prior Publication Data

US 2014/0278197 A1    Sep. 18, 2014

Related U.S. Application Data

(60) Provisional application No. 61/781,161, filed on Mar. 14, 2013.

(51) Int. Cl.
    *G01R 31/27*    (2006.01)
    *H01L 21/66*    (2006.01)
    *G01R 31/26*    (2014.01)

(52) U.S. Cl.
    CPC .......... *H01L 22/30* (2013.01); *G01R 31/2607* (2013.01); *G01R 31/27* (2013.01); *H01L 22/34* (2013.01)

(58) Field of Classification Search
    CPC combination set(s) only.
    See application file for complete search history.

(56) References Cited

U.S. PATENT DOCUMENTS

| | | | |
|---|---|---|---|
| 7,954,080 B2 | 5/2011 | Yen et al. | |
| 8,350,586 B2 * | 1/2013 | Cho et al. | 324/762.01 |
| 8,860,431 B2 * | 10/2014 | Degerstrom et al. | 324/601 |
| 9,103,884 B2 * | 8/2015 | Yen et al. | |
| 9,147,020 B2 * | 9/2015 | Cho et al. | |
| 2009/0216480 A1 * | 8/2009 | Kuo et al. | 702/118 |
| 2009/0224772 A1 * | 9/2009 | Jagannathan et al. | 324/601 |

(Continued)

FOREIGN PATENT DOCUMENTS

JP    2009-210381    *    9/2009    ............. G01R 31/26

OTHER PUBLICATIONS

U.S. Appl. No. 13/197,602, filed Aug. 3, 2011.

*Primary Examiner* — Huan Tran
(74) *Attorney, Agent, or Firm* — Eschweiler & Associates, LLC

(57) ABSTRACT

Some embodiments relate to a wafer. The wafer includes a first dummy component comprising two or more first dummy component transmission lines. One of the first dummy component transmission lines operably couples a first signal test pad to a second signal test pad, and an other of the first dummy component transmission lines operably couples a third signal test pad to a fourth signal test pad. A second dummy component comprises two or more second dummy component transmission lines. One of the second dummy component transmission lines operably couples a fifth signal test pad to a sixth signal test pad, and an other of the second dummy component transmission lines operably couples a seventh signal test pad to an eighth signal test pad. Other embodiments are also disclosed.

20 Claims, 6 Drawing Sheets

(56) References Cited

U.S. PATENT DOCUMENTS

2009/0224791 A1* 9/2009 Yen et al. ...................... 324/763
2011/0001504 A1* 1/2011 Cho et al. ................ 324/756.01
2011/0254576 A1* 10/2011 Cho ......................... 324/756.01
2012/0146680 A1   6/2012 Yen et al.
2013/0032799 A1* 2/2013 Yen et al. ....................... 257/48
2013/0093451 A1* 4/2013 Cho ......................... 324/756.01

* cited by examiner

4 PORT L-2L DE-EMBEDDING METHOD

CROSS REFERENCE TO RELATED APPLICATIONS

This is a Non-Provisional patent application claiming priority to U.S. Provisional Patent Application Ser. No. 61/781,161 filed Mar. 14, 2013 entitled "4 Port L-2L De-Embedding Method" in the name of Hsiao-Tsung Yen, et al., and is hereby incorporated by reference.

BACKGROUND

Integrated circuits (ICs) formed on semiconductor substrates include multiple active and passive components, such as resistors, inductors, capacitors, transistors, amplifiers, etc. Such components are fabricated to a design specification that defines the ideal physical/electrical characteristics the component will exhibit (e.g., resistance, inductance, capacitance, gain, etc.). Though it is desirable to verify that each component fabricated complies with its specific design specification, typically, after integration into a circuit, an individual component cannot be readily tested. Thus, "stand-alone" copies of the individual IC components, components fabricated with the same process and with the same physical/electrical characteristics as the IC components, are fabricated on the wafer; and it is assumed that the physical/electrical properties measured for the "stand-alone" copies represent those of the non-tested individual IC components.

During testing, the "stand-alone" copy, referred to as the "device-under-test" (DUT), is electrically connected to leads and test pads, which are further connected to external testing equipment. The leads may include so-called dummy components, which are formed on-wafer. Though the measured physical/electrical properties during testing should accurately represent those of the DUT (and the individual IC component represented), the test pads and leads contribute physical/electrical characteristics, known as "parasitics" (e.g., resistance, capacitance, and inductance from the test pads and leads), that contribute to the measured characteristics of the DUT. The parasitics are factored out or extracted by a process known as "de-embedding" to reveal the intrinsic characteristics of the DUT alone.

Thus, accurate de-embedding methods are required to eliminate the parasitic contributions and accurately describe the intrinsic characteristics of the DUT (and ultimately, the individual IC component represented). Currently, on-wafer de-embedding methods referred to as "open-short," "open-thru," and "thru-reflect-line" ("TRL") have been widely used to subtract parasitics such as resistance, inductance, and capacitance arising from the test pads and leads at high frequencies (up to the GHz level) for two port networks.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
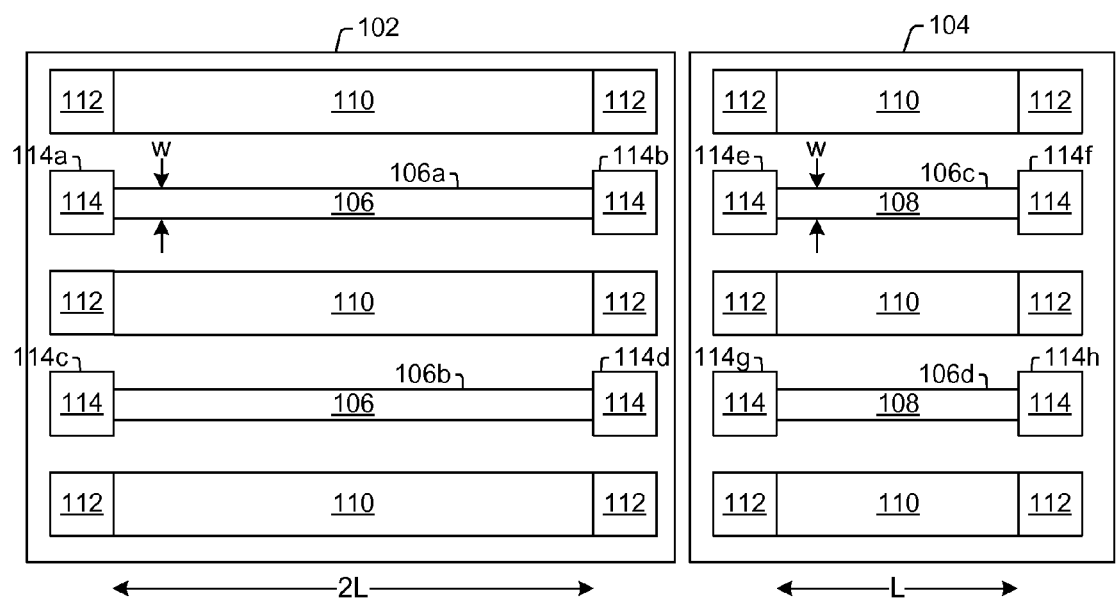
FIG. 1 is a block diagram of some embodiments of a test structure for de-embedding parasitics.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves. In addition, the present disclosure may repeat reference numerals and/or letters in the various examples. This repetition is for the purpose of simplicity and clarity and does not in itself dictate a relationship between the various embodiments and/or configurations discussed.

Conventional two-port methods present several problems: (1) the open-short method results in over de-embedding of the inductance parasitics from the lead metal lines; (2) the open-thru method accuracy depends on model fitting quality, often resulting in inaccurate parasitics extracted; (3) the TRL method requires at least three DUTs to cover a wide frequency range; and (4) all current methods use an approximate open pad. Further, conventional two-port network techniques are not applicable for DUTs having multiple terminals. In cases where multiple terminals are used (e.g., 4-port or 6-port test structures), coupling between the ports of the test structures render the two-port techniques of little or no use. Accordingly, what is needed is a test structure and method for improving the accuracy of de-embedding parasitics, particularly in the context of 4-port or higher order test structures.

The present disclosure relates generally to the field of integrated circuits testing, and more particularly, to a system and method for de-embedding parasitics for on-wafer devices. Whereas previous systems have only used two port network configurations, the present disclosure provides for 2*N port configurations (where N is a positive integer of two or greater) such as 4-port or 6-port networks, wherein the 2*N ports (e.g., 4-port or 6-ports) do not include ground ports as being counted towards the 2*N ports. In some embodiments, 2*N ports may include AC ground ports, which might contain DC bias. In some application the DC bias may be within a range around −2.5V to 2.5V. For example, whereas previous systems may have included two-port networks in ground-signal (GS) or ground-signal-ground (GSG) configurations, the present disclosure includes four-port networks in ground-signal-signal-ground (GSSG) and ground-signal-ground-signal-ground (GSGSG) configurations, among others. These 4-port (or higher order) networks allow testing of new types of devices, such as transformers or some MOS-type devices, which were previously un-amenable to de-embedding. Due to the complicated coupling between the four ports (or more) of the test network, de-embedding techniques used in traditional 2-port networks are not applicable in the context of 4-port and higher level network devices.

With reference to FIGS. 1 through 4B, a four-port test structure 100 and a method 400 for accurately de-embedding parasitics for on-wafer devices are collectively described below. It is understood that additional features can be added in the four-port test structure 100, and some of the features described below can be replaced or eliminated in alternative embodiments of the test structure. It is further understood that additional steps can be provided before, during, and after the method 400 described below, and some of the steps described below can be replaced or eliminated in alternative embodiments of the method. The present embodiment of test structure 100 and method 400 significantly improves de-embedding accuracy of 4-port (or higher order) test structure parasitics, such as resistance, inductance, and capacitance.

Referring to FIG. 1, the four-port test structure 100 comprises a first dummy component 102, a second dummy component 104, first dummy component transmission lines 106, second dummy component transmission lines 108, power lines 110, and test pads 112, 114. The first dummy component 102 is coupled with the second dummy component 104. The first and second dummy components 102, 104 each include four test pads 114 that act as signal ports, as well as six test pads 112 that act as ground terminals. The presence of the four signal port test pads 114 for each of the dummy components renders the test structure a "4-port" network, due to the test structure 100 have two signal ports at each of its ends for a total of four ports if the test structure 100 is viewed as a "black box".

The first dummy component 102 comprises two or more first dummy component transmission lines 106 each having length 2L. The second dummy component 104 comprises two or more second dummy component transmission lines 108 each having length L (i.e., the first dummy component transmission lines 106 are each two times longer than each of the second dummy component transmission lines 108). The first and second dummy component transmission lines 106, 108 lie on or within the same semiconductor wafer. Often, first and second dummy component transmission lines 106, 108 are co-linear and have the same width, w, but in alternate embodiments, the first and second dummy component transmission lines 106, 108 may be non-co-linear and/or have different widths.

In FIG. 1, transmission lines 106 couple neighboring signal test pads 114, and power lines 110 couple neighboring ground test pads 112. One of the first dummy component transmission lines (e.g., 106a) couples first signal test pad (e.g., 114a) to second signal test pad (e.g., 114b), while the other of the first dummy component transmission lines (e.g., 106b) couples third signal test pad (e.g., 114c) to fourth signal test pad (e.g., 114d). Similarly, one of the second dummy component transmission lines (e.g., 106c) couples fifth signal test pad (e.g., 114e) to sixth signal test pad (e.g., 114f), while the other of the second dummy component transmission lines (e.g., 106d) couples seventh signal test pad (e.g., 114g) to eighth signal test pad (e.g., 114h). Thus, the signal test pads 114 and ground test pads 112 are implemented in a ground-signal-ground-signal ground (GSGSG) test configuration.

Transmission lines 106, power lines 110, and test pads 112, 114 may comprise any conducting material, such as aluminum, copper, aluminum-copper alloys, aluminum alloys, copper alloys, other metals, polysilicon, any other material, and/or combinations thereof.

Figure 2A:
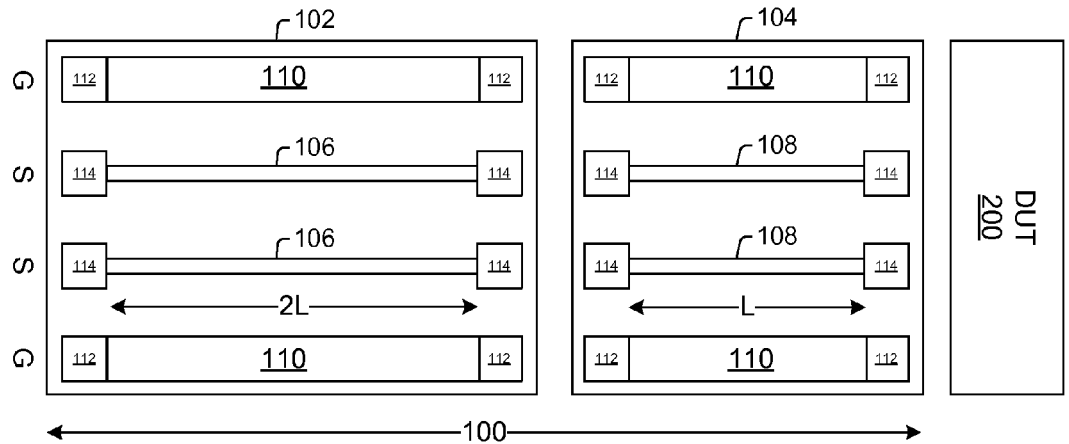
FIGS. 2A-2D are top views of some embodiments of a test structure for de-embedding parasitics coupled with a device-under-test.

FIGS. 2A-2D show some alternate configurations of four port test structure 100. More particularly, FIG. 2A provides a top view of four-port test structure 100 coupled with a device-under-test (DUT) 200. In FIG. 2A, the first dummy component 102 couples with the second dummy component 104, and the second dummy component couples with DUT 200. In some embodiments, the test structure 100 is coupled with DUT 200 in the form of a transformer. In alternate embodiments, the DUT 200 may be any other suitable 4 port DUT, such as two resistors, two capacitors, two diodes, two inductors, two co-planar wave guides, any other component on an IC, or combinations of two such devices (e.g., a resistor and capacitor, or a diode and inductor, etc.). Further, in alternate embodiments, the arrangement of the first dummy component 102 and second dummy component 104 may be reversed, where the first dummy component 102 (comprising the first dummy component transmission line 106 of length 2L) may be coupled with the DUT 200 and then further coupled with the second dummy component 104 (comprising the second dummy component transmission line 108 of length L). In addition, though FIG. 2A shows the test structure 100 coupled with the DUT 200 in one location, in alternate embodiments, the test structure 100 may be coupled at multiple locations to the DUT 200. Also, in some embodiments, only one 4-port test structure 100 couples with the DUT 200; however, in alternate embodiments, multiple test structures 100, which can include 4 port network(s) and/or network(s) with other numbers of ports, may be coupled with the DUT 200.

The four-port test structure 100 couples to the DUT 200 in order to determine the intrinsic characteristics of the DUT 200. In FIG. 2A's embodiment, during testing, the DUT 200 is coupled with the first dummy component 102 and the second dummy component 104, which are further connected to external testing equipment. Though the measured physical/electrical properties should accurately represent those of the DUT 200 alone, the four-port test structure 100 contributes physical/electrical characteristics, known as "parasitics" (e.g., resistance, capacitance, and inductance from the transmission lines and test pads), that ultimately contribute to the measured characteristics of the DUT. In the present embodiment, the first dummy component transmission line 106, the second dummy component transmission line 108, and signal test pads 114 contribute parasitics to the measured characteristics of the DUT 200. In alternate embodiments, the ground test pads 112 and power lines 110 may also contribute parasitics to the overall measured physical/electrical characteristics of the DUT 200.

Figure 2B:
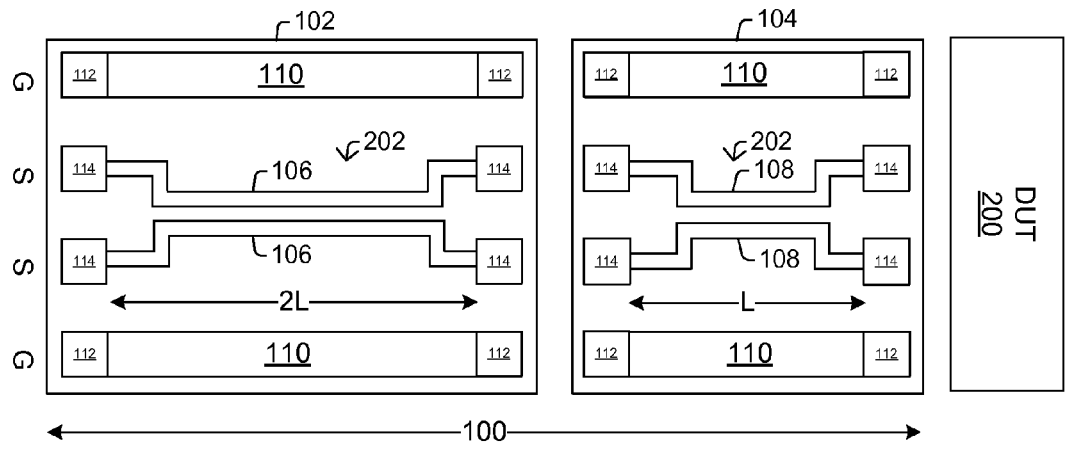
Figure 2C:
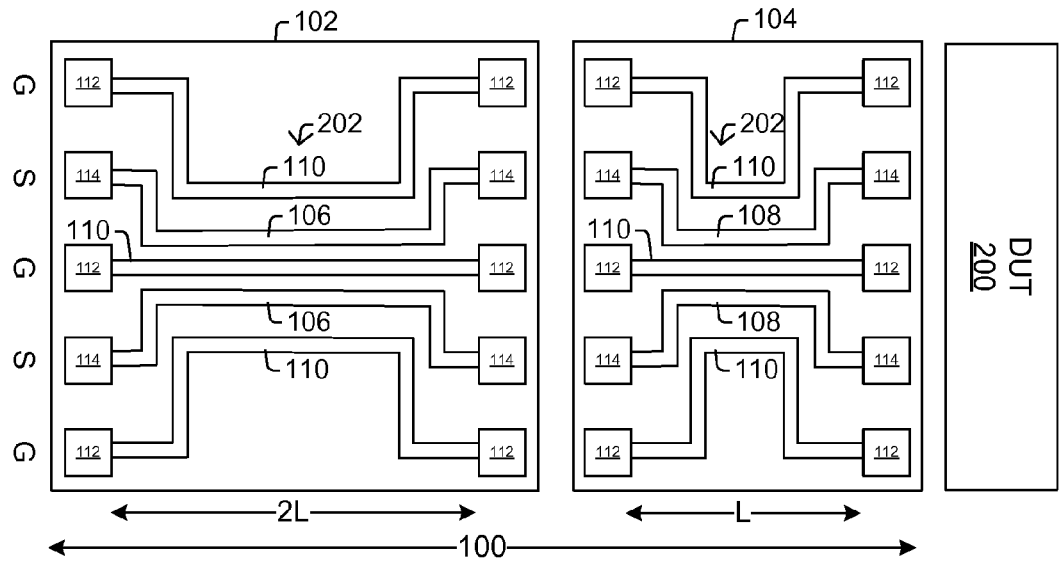
Figure 2D:
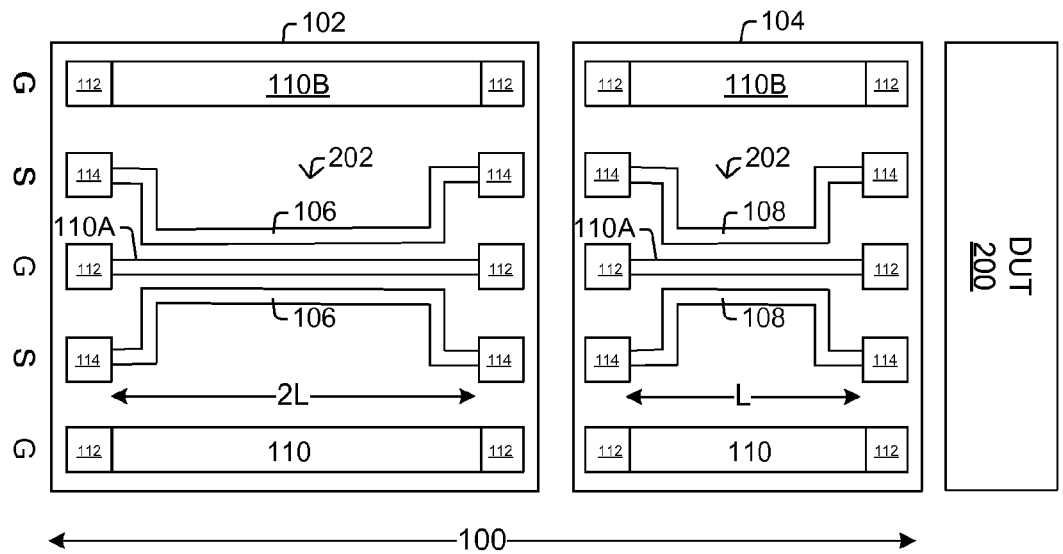

The test structure 100 as depicted in FIG. 2A is not limiting in any regard, and numerous other configurations for 4-port test structures are also contemplated as falling within the scope of the present disclosure, as will be appreciated in more detail as shown in FIGS. 2B-2D, for example. In FIG. 2B, the power lines 110 still extend linearly between neighboring ground pads 112, however the transmission lines 106, 108 now each bend inwards towards one another at central region 202. Further, whereas FIGS. 2A-2B show examples where the individual power lines 110 are wider than the individual transmission lines 106, 108, FIG. 2C shows an example where the AC ground lines 110 and transmission lines 106, 108 have approximately equal widths. In this example, all AC ground and transmission lines bend inwards towards one another at central region 202. FIG. 2D shows another example where a central AC ground line 110A is linear and has the same width as transmission lines 106, 108, while outer power lines 110B are linear and wider. It will be appreciated that these example features can be combined in any number of ways, and variations are also contemplated as falling within the scope of this disclosure. For example, rather than lines bending inwardly towards central region as illustrated, lines could also divert away from one another at a central region. Further, lines could also include multiple bends and need not follow a symmetric pattern as provided in the illustrated examples. However, using a symmetric layout does allow for some simplifications when solving the matrixes for de-embedding parasitics, as will be appreciated in greater detail with regards to FIGS. 5A-5B further herein.

Figure 3:
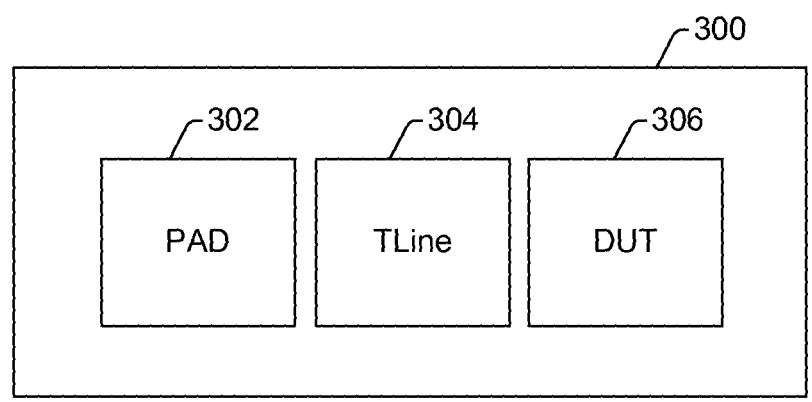
FIG. 3 illustrates a block diagram of some embodiments of a test structure coupled with a device-under-test.

FIG. 3 provides a simple block diagram reflecting how each test pad and transmission line contributes physical/electrical characteristics to the measured characteristics of the DUT 200. Block 300 represents the measured characteristics of the DUT 200, which includes parasitics from each signal test pad 114, parasitics from each first dummy component transmission line 106, parasitics from each second dummy component transmission line 108, as well as the actual physical/electrical characteristics of DUT. Thus, in FIG. 3, block 302 represents the parasitics contributed by the test pads 114; block 304 represents the parasitics contributed by the transmission lines 106, 108; and block 306 represents the intrinsic characteristics of the DUT 200. In alternate embodiments, block 302 may include parasitics contributed by ground test pads 112, and/or block 304 may include parasitics contributed by power lines 110. To obtain the intrinsic characteristics of the DUT 200 alone (i.e., the characteristics of block 306 alone), the contributions from blocks 302 and 304 must be factored out or extracted (i.e., de-embedded) from the measured characteristics of the DUT (block 300). In other words, the parasitics from the signal test pads 114, the first transmission line 106, and the second transmission line 108 must be de-embedded. It is understood that in alternate embodiments the parasitics from the ground test pads 112 and AC ground lines 110 may also contribute to the measured electrical characteristics of the DUT 200 and may need to be de-embedded.

Figure 4A:
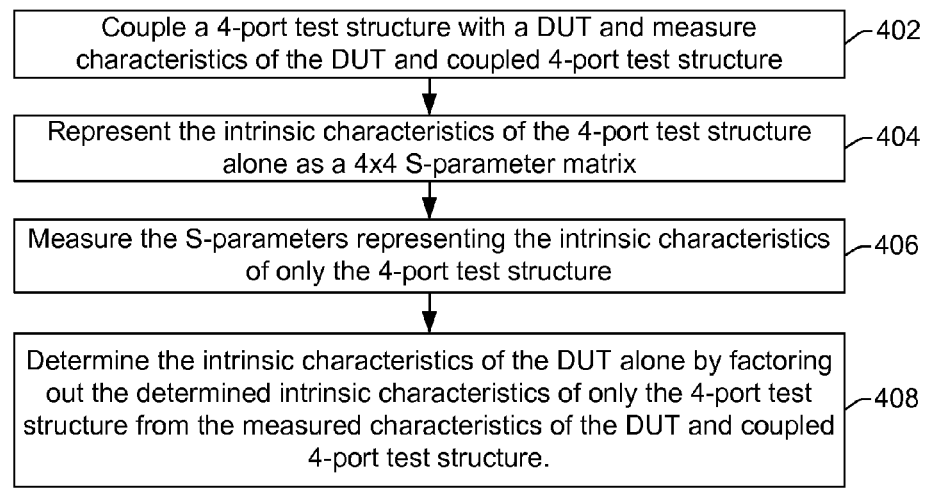
FIG. 4A is a flow chart of some embodiments of a method for de-embedding parasitics.

FIG. 4A is a flow diagram of a de-embedding process for accurately obtaining the intrinsic characteristics of the DUT 200 alone in accordance with various embodiments of the present disclosure. In operation, the test structure 100 utilizes the method 400 to determine the intrinsic characteristics of the DUT 200 alone by de-embedding the parasitics (i.e., the resistance, capacitance, inductance, etc. arising from the test pads 114, 112 and transmission lines 106, 108). Whereas two-port networks used ABCD matrix parameters for de-embedding, the present four-port techniques use S-parameters for de-embedding. S-parameters differ from Y-parameters, Z-parameters, H-parameters, T-parameters and ABCD-parameters in the sense that S-parameters do not use open or short circuit conditions to characterize a linear electrical network. Instead, S-parameters use matched load terminations to characterize the network. Compared to open-circuit and short-circuit terminations, these matched load terminations are better suited for high signal frequencies. Moreover, the quantities for S-parameters are measured in terms of power.

Referring to FIGS. 1-4B, the method 400 begins with step 402, which involves coupling the 4-port test structure 100, which includes at least two dummy components 102, 104, at least two transmission lines 106, 108, and at least two test pads 114, 112, to the DUT 200. Once the test structure 100 is coupled with the DUT 200, the characteristics of the DUT 200 along with the 4-port network are measured. As noted above, in step 402, parasitics from the test structure 100 contribute to the measured characteristics of the DUT 200. Accordingly, such parasitics contributed by the test structure 100 must be determined and extracted to obtain an accurate measurement for the intrinsic characteristics of the DUT 200.

In step 404, the intrinsic characteristics of the four-port test structure alone are represented as S-parameters arranged in a 4×4 matrix for a 4-port network. This representation requires decomposing the parasitics contributed by the first dummy component 102 and second dummy component 104. The parasitics of the first dummy component 102, which comprises two dummy component first transmission lines 106 of length 2L, may be represented by [2L], which is a 4×4 matrix of 16 S-parameters that characterize the first dummy component 102. The parasitics of the second dummy component 104, which comprises two second dummy component transmission lines 108 of length L, may be represented by [L], which is a 4×4 matrix of 16 S-parameters that characterize the first dummy component. In alternate embodiments, the first dummy component 102 may comprise dummy component transmission lines of length L and be represented by [L], and the second dummy component 104 may comprise dummy component transmission lines of length 2L and be represented by [2L], where [L] and [2L] are each a 4×4 matrix of 16 S-parameters.

Figure 4B:
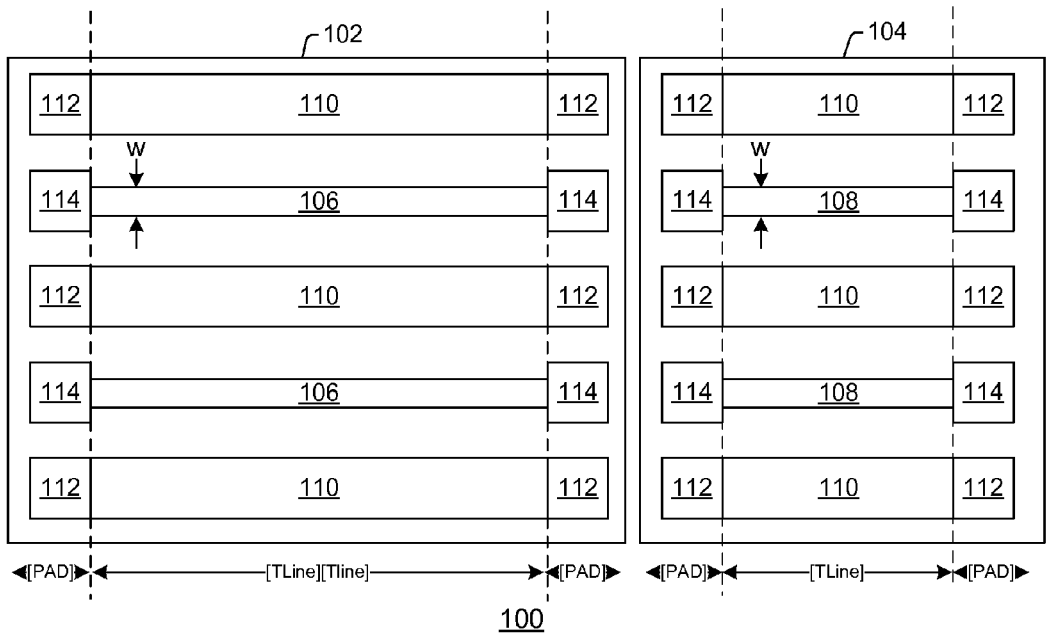
FIG. 4B is a block diagram of some embodiments of a test structure for de-embedding parasitics.

With reference to FIG. 4B, the four-port test structure 100 is divided into separate portions that contribute to the overall parasitics arising from the first and second dummy components 102, 104. As noted above, the intrinsic characteristics of the four-port test structure 100 arise from the signal test pads 112, the first dummy component transmission lines 106, and the second dummy component transmission lines 108, which must be factored out or extracted (i.e., de-embedded). In some embodiments, the parasitics contributed by a single test pad are represented by the matrix [PAD], and the parasitics contributed by a dummy component transmission line of length L are represented by the matrix [TLine]. In alternate embodiments, [PAD] may represent parasitics contributed by multiple test pads, and [TLine] may represent parasitics contributed by multiple transmission lines of length L or a transmission line of a length other than L.

In some embodiments, the parasitics contributed from the first and second dummy components 102, 104 arise from the first and second dummy component transmission lines 106, 108 and the signal test pads 114. So, with reference to FIG. 4B, the parasitics resulting from the second dummy component 104 (now represented by matrix [L]), comprise the parasitics of the first signal test pad 114e ([PAD]), the second dummy component transmission lines 108 of length L ([TLine]), and the second signal test pad 114f ([PAD]). Thus, the second dummy component 104 is decomposed into S-parameter matrix components, where the following formula represents the contributed parasitics:

$$[L]=[PAD][TLine][PAD] \qquad (1)$$

where [L] is the parasitics attributable to the second dummy component, [PAD] is an S-parameter matrix representing the parasitics contributed by one test pad, and [TLine] is an S-parameter matrix representing the parasitics contributed by a transmission line of length L. Similarly, the parasitics resulting from the first dummy component 102 comprise the parasitics of the first signal test pad 114a ([PAD]), the first dummy component transmission lines 106 of length 2L ([TLine][TLine]), and the second signal test pad 114b ([PAD]). Thus, the second dummy component 104 is decomposed into S-parameter matrix components, where the following formula represents the contributed parasitics:

$$[2L]=[PAD][TLine][TLine][PAD], \qquad (2)$$

where [2L] is the parasitics attributable to the second dummy component, [PAD] is an S-parameter matrix representing the parasitics contributed by one test pad, and [TLine] is an S-parameter matrix representing the parasitics contributed by a transmission line of length L. It is understood that, in alternate embodiments, parasitics may arise from the ground test pads 112 and power lines 110 and may similarly be represented by matrices [PAD] or [TLine].

In step 406, the intrinsic characteristics of the test structure alone are determined. By manipulating equations (1) and (2) above, [PAD] and [TLine] may be solved for using T-parameters and represented by the following equations:

$$[PAD][PAD]=[TL][2L]^{-1}[TL] \quad (3)$$

$$[TLine]=[PAD]^{-1}[L][PAD]^{-1} \quad (4)$$

From equation (3), [PAD] is easily calculated by plugging in measurable data. Then, [TLine] is determined. When equations (3) and (4) are solved, all parasitics of the test structure 100 contributing to the measured characteristics of the DUT 200 (measured in step 402) are known.

In step 408, the intrinsic characteristics of the DUT alone are determined. This may be accomplished by factoring out or extracting the intrinsic characteristics of the 4-port test structure 100 alone, determined in step 406, from the measured characteristics of the coupled DUT 200 and 4-port test structure that were determined in step 402. For example, with reference to FIG. 3, blocks 302 and 304, the parasitics contributed by the test pads and transmission lines of the test structure 100, are extracted from block 300, the measured characteristics of the DUT 200, to obtain block 306, the intrinsic characteristics of the DUT 200 alone.

Figure 5A:
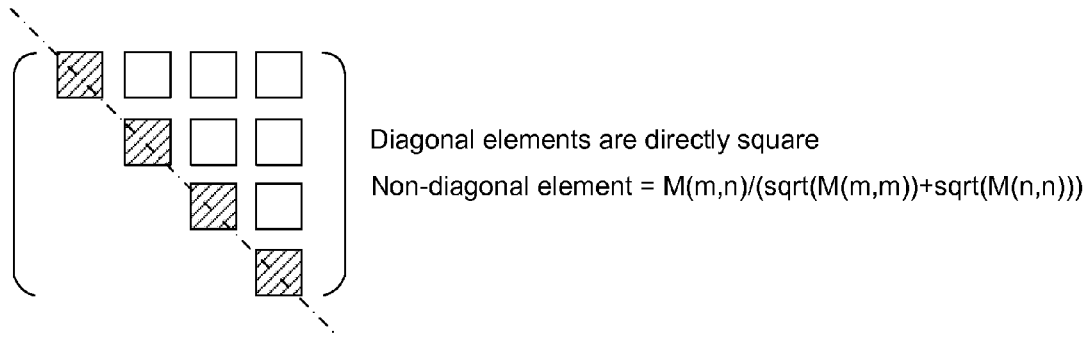
FIGS. 5A-5B illustrate some embodiments of a technique for solving a square root of a matrix of T-parameters.
Figure 5B:
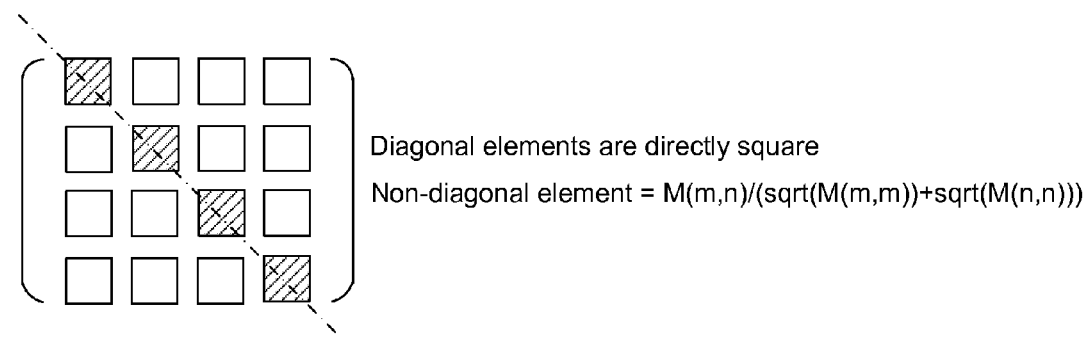

In some instances when solving these matrices, it may be advantageous to find a square root of a matrix. For example, when solving equation (3) above, it may be convenient to plug in values for [TL] and $[2]^{-1}$ and find numerical values for the right hand side of equation 3, then find the square root of the numerical values to find [PAD]. Unfortunately, in some instances, this square root problem is extremely difficult, if not impossible, to solve using conventional de-embedding techniques, particularly for the off-diagonal or non-diagonal matrix elements. FIGS. 5A-5B show techniques to solve the square root in an efficient manner in accordance with various embodiments of the present disclosure. In FIGS. 5A-5B, for T-parameter elements along the diagonal (e.g., $T_{1,1}$, $T_{2,2}$, $T_{3,3}$, and $T_{4,4}$), the values are squared directly. For non-diagonal elements an approximation is used. In this approximation, T-parameters off the diagonal are calculated by setting a T-parameter on an nth column and mth row (N≠M) to be inversely proportional to a sum of a square root of a first T-parameter on an nth row of the diagonal plus a square root of a second s-parameter on an mth row of the diagonal. For example, for the T-parameter located at the intersection of the first row and second column (e.g., $T_{1,2}$), the approximated T-parameter is equal to the measured t-parameter ($T_{1,2}$) divided by sum of the square root of $T_{1,1}$ plus the square root of $T_{2,2}$. For the T-parameter located at the intersection of the first row and third column (e.g., $T_3$), the approximated t-parameter is equal to the measured t-parameter ($T_{1,3}$) divided by sum of the square root of $T_{1,1}$ plus the square root of $T_{3,3}$. For the T-parameter located at the intersection of the second row and third column (e.g., $T_{2,3}$), the approximated t-parameter is equal to the measured t-parameter ($T_{2,3}$) divided by sum of the square root of $T_{2,2}$ plus the square root of $T_{3,3}$, and so on. FIG. 5A illustrates the case when T-parameters on only one side of a diagonal are approximated, while FIG. 5B illustrates the case when T-parameters on both sides of the diagonal are approximated. This technique is also applicable to S-parameters or other parameters.

Thus, some embodiments of the present disclosure relate to a wafer including at least one die that comprises a plurality of devices and at least one four-port test structure for de-embedding at least one of the devices which is referred to as a device under test (DUT). The four port test structure on the wafer comprises a first dummy component comprising two or more first dummy component transmission lines. One of the first dummy component transmission lines operably couples a first signal test pad to a second signal test pad. An other of the first dummy component transmission lines operably couples a third signal test pad to a fourth signal test pad. The four port test structure also comprises a second dummy component comprising two or more second dummy component transmission lines. One of the second dummy component transmission lines operably couples a fifth signal test pad to a sixth signal test pad. An other of the second dummy component transmission lines operably couples a seventh signal test pad to an eighth signal test pad. The second signal test pad is adjacent to the fifth signal test pad and wherein the fourth signal test pad is adjacent to the seventh signal test pad.

Other methods relate to a method for de-embedding an on-wafer device. In this method, a device-under-test ("DUT") and a 2×N-port test structure are provided, wherein N is an integer greater than or equal to two. The 2×N-port test structure includes at least two transmission lines and at least four test pads. Intrinsic characteristics of the 2×N-port test structure are represented using a matrix. The intrinsic characteristics of the 2×N-port test structure are determined by placing measured values for parameters on a diagonal of the matrix and placing approximated values for parameters off the diagonal of the matrix. The determined intrinsic characteristics of the 2×N-port test structure are used to produce a set of parameters representative of the intrinsic characteristics of solely the DUT by factoring out the determined intrinsic characteristics arising from the at least two transmission lines and the at least four test pads of the test structure.

Still another embodiment relates to a test structure for de-embedding an on-wafer device. The test structure includes a first dummy component and a second dummy component coupled to the first dummy component. The first dummy component comprises two or more first dummy component transmission lines of length L. The second dummy component comprises two or more second dummy component transmission lines of length 2L. The two or more second dummy component transmission lines are co-linear with the two or more first dummy component transmission lines. The two or more first dummy component transmission lines are positioned only within the first dummy component, and the two or more second dummy component transmission lines are positioned only within the second dummy component. A device-under-test is electrically coupled to at least one of the first dummy component or the second dummy component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A wafer including at least one die that comprises a plurality of devices and at least one four-port test structure for de-embedding at least one of the devices which is referred to as a device under test (DUT), wherein the four port test structure on the wafer comprises:
    a first dummy component comprising two or more first dummy component transmission lines and two or more power lines, wherein one of the first dummy component transmission lines operably couples a first signal test pad to a second signal test pad, and wherein an other of the first dummy component transmission lines operably couples a third signal test pad to a fourth signal test pad, wherein one of the power lines is arranged about an outermost side of the one of the first dummy component transmission lines and an other of the power lines is arranged about an outermost side of the other of the first dummy component transmission lines;
    a second dummy component comprising two or more second dummy component transmission lines, wherein one of the second dummy component transmission lines operably couples a fifth signal test pad to a sixth signal test pad, and wherein an other of the second dummy component transmission lines operably couples a seventh signal test pad to an eighth signal test pad;
    wherein the second signal test pad is adjacent to the fifth signal test pad and wherein the fourth signal test pad is adjacent to the seventh signal test pad.

2. The wafer of claim 1, wherein the DUT is configured to be coupled to external test equipment via the first dummy component and the second dummy component.

3. The wafer of claim 2, wherein the first and third signal test pads are adapted to be coupled to the external test equipment and wherein the sixth and eighth signal test pads are coupled to the DUT.

4. The wafer of claim 1 wherein the first dummy component further comprises a power line arranged between the one and the other of the first dummy component transmission lines, and further comprises power line test pads at distal ends of the power line.

5. The wafer of claim 4 wherein the power line test pads comprise ground test pads electrically connected to the power line.

6. The wafer of claim 5, wherein the power lines each have a power line width which is at least approximately twice as large as a transmission line width of the one dummy component transmission line.

7. The wafer of claim 1 wherein the two or more first dummy component transmission lines each have a first equal length of 2L and the two or more second dummy component transmission lines each have a second equal length of L.

8. The wafer of claim 1 wherein the two or more first dummy component transmission lines and the two or more second dummy component transmission lines have the same width.

9. A method for de-embedding an on-wafer device comprising:
    providing a device-under-test ("DUT") and a 2×N-port test structure, wherein N is an integer greater than or equal to two, and wherein the 2×N-port test structure includes at least two transmission lines and at least four test pads;
    representing intrinsic characteristics of the 2×N-port test structure using a matrix;
    determining the intrinsic characteristics of the 2×N-port test structure by placing measured values for parameters on a diagonal of the matrix and placing approximated values for parameters off the diagonal of the matrix, wherein the approximated values are S-parameters or T-parameters, and wherein an approximated S or T-parameter, which is to be placed at an nth column and mth row, is inversely proportional to at least one of a first S- or T-parameter on an nth column of the diagonal or a second S- or T-parameter on an mth row of the diagonal; and
    using the determined intrinsic characteristics of the 2×N-port test structure to produce a set of parameters representative of the intrinsic characteristics of solely the DUT by factoring out the determined intrinsic characteristics arising from the at least two transmission lines and the at least four test pads of the test structure.

10. The method of claim 9, wherein representing the intrinsic characteristics of the 2×N-port test structure comprises representing intrinsic characteristics of a first dummy component and a second dummy component in T-parameter components that make up the matrix, wherein the first and second dummy components each comprise at least four test pads and at least two transmission lines.

11. The method of claim 10, wherein the approximated values are S-parameters or T-parameters, and wherein the approximated S- or T-parameter, which is to be placed at the nth column and mth row, is inversely proportional to a sum of a square root of the first S- or T-parameter on the nth column of the diagonal plus a square root of the second S- or T-parameter on the mth row of the diagonal.

12. The method of claim 11, wherein representing the intrinsic characteristics of the 2×N port test structure using the matrix comprises:
    representing intrinsic characteristics of the first dummy component by matrix [2L], wherein [2L]=[PAD][TLine][TLine][PAD], and wherein at least one transmission line of the first dummy component comprises length 2L; and
    representing intrinsic characteristics of the second dummy component by matrix [L], wherein [L]=[PAD][TLine][PAD], and wherein at least one transmission line of the second dummy component comprises length L.

13. The method of claim 12, wherein determining the intrinsic characteristics arising from the test structure comprises: determining the intrinsic characteristics arising from the at least one test pad of the first dummy component and the second dummy component; and determining the intrinsic characteristics arising from the at least one transmission line of the first dummy component and the second dummy component.

14. The method of claim 12, wherein determining the intrinsic characteristics arising from the at least one test pad comprises representing the intrinsic characteristics of the at least one test pad by matrix [PAD] in S-parameter matrix components or T-parameter matrix components.

15. The method of claim 12, wherein determining the intrinsic characteristics arising from the at least one transmission line comprises representing the intrinsic characteristics of the at least one transmission line by matrix [TLine] in S-parameter matrix components or T-parameter matrix components, wherein [TLine] represents the intrinsic characteristics of a transmission line comprising length L.

16. The method of claim 12, wherein determining the intrinsic characteristics arising from the at least one test pad further comprises manipulating matrices [2L] and [L], wherein [PAD][PAD]=[TL][2L]$^{-1}$[TL].

17. The method of claim 12, wherein determining the intrinsic characteristics arising from the at least one transmission line further comprises manipulating matrices [2L] and [L], wherein [TLine]=[PAD]$^{-1}$[L][PAD]$^{-1}$.

18. A test structure for de-embedding an on-wafer device comprising:
a first dummy component, wherein the first dummy component comprises two or more first dummy component transmission lines of length L, wherein the two or more first dummy component transmission lines reflect one another across an axis that is disposed between the two or more first dummy component transmission lines, wherein a power line is not disposed between the two or more first dummy component transmission lines;
a second dummy component coupled with the first dummy component, wherein the second dummy component comprises two or more second transmission lines of length 2L, the two or more second transmission lines being co-linear with the two or more first dummy component transmission lines, wherein the two or more first dummy component transmission lines are positioned only within the first dummy component and the two or more second dummy component transmission lines are positioned only within the second dummy component; and
a device-under-test electrically coupled to at least one of the first dummy component or the second dummy component.

19. The test structure of claim 18, wherein the first dummy component further comprises:
a first power line co-linear with the two or more first dummy component transmission lines and arranged about an outermost side of a first of the neighboring first dummy component transmission lines; and
a second power line co-linear with the first power line and arranged about an outermost side of a second of the neighboring first dummy component transmission lines.

20. The wafer of claim 1, wherein the two or more first dummy component transmission lines are nonlinear and reflect one another across an axis that is disposed between the two or more first dummy component transmission lines.

* * * * *